(12) United States Patent
Lee et al.

(10) Patent No.: US 11,988,706 B2
(45) Date of Patent: May 21, 2024

(54) TRACE LEVEL VOLTAGE SENSOR FOR MULTI-LAYER PRINTED CIRCUIT BOARDS

(71) Applicant: Quanta Computer Inc., Taoyuan (TW)

(72) Inventors: Yangtzu Lee, Taoyuan (TW); Wei-Chih Chen, Taoyuan (TW); Pin-Hao Hung, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 204 days.

(21) Appl. No.: 17/646,436

(22) Filed: Dec. 29, 2021

(65) Prior Publication Data

US 2023/0204652 A1 Jun. 29, 2023

(51) Int. Cl.
*G01R 31/28* (2006.01)
*G01R 19/165* (2006.01)
*H05K 1/02* (2006.01)

(52) U.S. Cl.
CPC ...... *G01R 31/2812* (2013.01); *G01R 19/16576* (2013.01); *H05K 1/0298* (2013.01); *H05K 2201/10151* (2013.01)

(58) Field of Classification Search
CPC .............. G01R 31/2812; G01R 19/16576
See application file for complete search history.

(56) References Cited

U.S. PATENT DOCUMENTS

| 11,175,215 | B2 | 11/2021 | Birch et al. |
| 2003/0050010 | A1* | 3/2003 | Fallenstein ............... H04B 5/02 455/41.1 |
| 2020/0025671 | A1 | 1/2020 | Birch et al. |

FOREIGN PATENT DOCUMENTS

CN 111737077 A 10/2020

OTHER PUBLICATIONS

TW Office Action for Application No. 111112481, dated Oct. 31, 2022, w/ First Office Action Summary.
TW Search Report for Application No. 111112481, dated Oct. 31, 2022, w/ First Office Action.

* cited by examiner

*Primary Examiner* — Minh Q Phan
(74) *Attorney, Agent, or Firm* — NIXON PEABODY LLP

(57) ABSTRACT

A voltage sensor system for determining an abnormal circuit condition in a multi-layer printed circuit board is disclosed. The printed circuit board has a plurality of layers. One of the layers includes a trace network and a sensor circuit. The sensor circuit includes the trace network and a sensing point. The sensor circuit is coupled between a voltage supply and a ground. A controller is coupled to the sensing point. The controller is operable to determine a voltage of the sensing point and compare the voltage to a threshold value to determine an abnormal circuit condition in the printed circuit board.

20 Claims, 5 Drawing Sheets

TRACE LEVEL VOLTAGE SENSOR FOR MULTI-LAYER PRINTED CIRCUIT BOARDS

FIELD OF THE INVENTION

The present invention relates generally to monitoring operation of printed circuit boards, and more specifically, to a trace sensor that allows detection of short circuits between layers of a printed circuit board.

BACKGROUND

Cellular networks rely on various electronic devices, such as radios and antennas, which are mounted on support structures exposed to the environment. For example, components are often mounted on support structures at heights of 100 feet or more. As such, these electronic devices are exposed to inclement weather.

For example, a 5G component may have an exterior cabinet that houses electronic equipment. Such components may include 5G Central Units (CU), distributed units (DU), Remote Radio Units (RRU), Active Antenna Units (AAU), and Radio Units (RU). The exterior cabinet typically holds one or more multi-layer printed circuit boards that include electronic components such as controllers, processors, memory, network devices, and the like. Such circuit boards are typically composed of insulative material with conductive traces formed on the insulation material. Unlike servers in data centers where the environmental conditions are tightly controlled, 5G components are exposed to harsh environmental conditions including high heat, humidity, salt, sulfur dioxide exposure, rain, and direct sunlight. If the systems are exposed to a humid environment for too long, water and the associated dissolved chemicals may seep into the exterior cabinet and eventually expose the printed circuit board.

Even computer systems that are stored indoors, such as servers in data centers, may risk damage from humidity or other environmental factors due to factors such as flawed interior location. When a printed circuit board is exposed to humidity and salt, an undesirable chemical reaction with the trace materials on the layers may occur. Under positive electrical charge that may be generated by power to the traces, a copper "bridge" may be formed between two traces of different layers. Most common and most dangerously, the copper bridge may be formed between a power trace and a ground trace. This may eventually cause a power to ground short, and consequently cause a system fault and/or catastrophic thermal/fire event for the component associated with the printed circuit board.

To prevent this situation, a new method to remotely sense PCB failure before a system malfunction occurs is needed. Another need is for a monitoring system that may provide data to assist in failure analysis of a printed circuit board. Another need is for a trace based sensor that allows determination of the possibility of an open circuit or a short circuit condition in a multi-layer printed circuit board.

SUMMARY

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to certain aspects of the present disclosure, a voltage sensor system for determining an abnormal circuit condition in a multi-layer printed circuit board is disclosed. The printed circuit board has a plurality of layers. One of the layers includes a trace network and a sensor circuit. The sensor circuit includes the trace network and a sensing point. The sensor circuit is coupled between a voltage supply and a ground. A controller is coupled to the sensing point. The controller is operable to determine a voltage of the sensing point and compare the voltage to a threshold value to determine an abnormal circuit condition in the printed circuit board.

A further implementation of the example voltage sensor system includes multiple sensor circuits on the other layers of the printed circuit board. Each of the sensor circuits includes a sensing point. Another implementation is where the example voltage sensor system includes a multiplexer having inputs and an output. Each of the inputs is coupled to one of the sensing points. The output is coupled to the controller. The controller is operable to select one of sensing points. Another implementation is where the circuit board is a motherboard, and where the controller is a baseboard management controller (BMC). Another implementation is where the sensor circuit includes a first resistor coupled to the voltage supply and the trace network. A second resistor is coupled to the trace network and the sensing point. A third resistor is coupled between the ground and the sensing point. The first, second, and third resistors are trace segments formed near the edges of the layer. Another implementation is where the threshold voltage is a predetermined value. Another implementation is where the threshold voltage is determined by an initial value of the sensing point measured when the printed circuit board is initially powered up. Another implementation is where the determination of the voltage of the sensing point occurs on a periodic basis. Another implementation is where the abnormal condition is a short circuit with a trace network of another layer, and the sensing voltage exceeds the threshold voltage. Another implementation is where the abnormal condition is an open circuit in the trace network, and the sensing voltage is less than the threshold voltage.

Another disclosed example is a method of determining an abnormal circuit condition in a multi-layer printed circuit board. A supply voltage is provided to a sensor circuit on one of the layers of the printed circuit board. The sensor circuit includes a trace network on the layer. A voltage value is determined from a sensing point of the sensor circuit. The voltage value from the voltage sensing point is compared to a threshold voltage value. It is determined whether an abnormal circuit condition exists based on the comparison.

A further implementation of the example method is where the printed circuit board includes multiple sensor circuits on the other layers. Each of the sensor circuits includes a sensing point. Another implementation is where the circuit board is a motherboard, and where the controller is a baseboard management controller (BMC). Another implementation is where sensor circuit includes a first resistor coupled to the voltage supply and the trace network. A second resistor is coupled to the trace network and the sensing point. A third resistor is coupled between the ground and the sensing point. The first, second, and third resistors are trace segments formed near the edges of the layer. Another implementation is where the threshold voltage is a predetermined value. Another implementation is where the threshold voltage is determined by an initial value of the sensing point measured when the printed circuit board is initially powered up. Another implementation is where the determination of the voltage of the sensing point occurs on a periodic basis. Another implementation is where the abnormal condition is a short circuit with a trace network of another layer, and the sensing voltage exceeds the threshold voltage. Another implementation is where the abnormal condition is an open circuit in the trace network, and the sensing voltage is less than the threshold voltage.

Another disclosed example is a computer device having a supply voltage source and a circuit board having multiple layers. Each of the multiple layers have a trace network. At least one of the layers includes a sensor circuit having the trace network, a sensing point, and trace segments near the edges of the layer completing a circuit between the supply voltage source and a ground. The device has a baseboard management controller (BMC) coupled to the sensing point. The BMC reads a voltage from the sensing point and compares the voltage with a threshold voltage to determine an abnormal circuit condition in the circuit board.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

DETAILED DESCRIPTION

Figure 1:
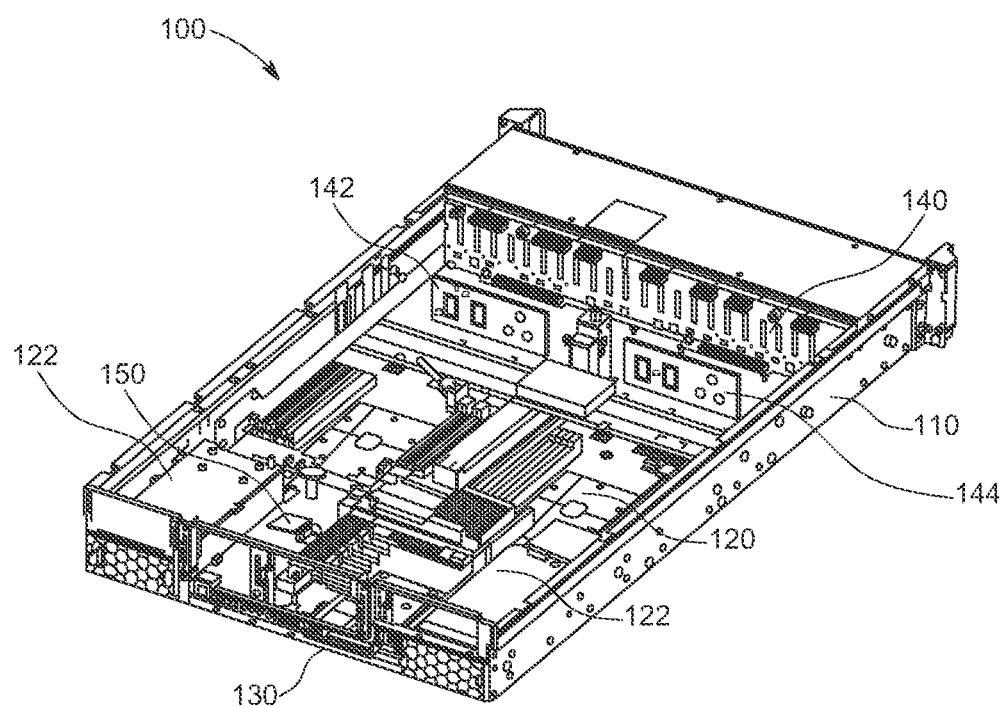
FIG. 1 is a perspective diagram of a 5G component with example printed circuit boards with voltage trace sensors according to certain aspects of the present disclosure.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

The present disclosure relates to forming traces on the edges of certain layers of a multi-layer printed circuit board for voltage sensing. The edge traces serve as part of a voltage sensing circuit that allows detection of the potential of an abnormal circuit condition such as a short circuit between the layers of the printed circuit board or an open circuit in the trace network of one of the layers of the printed circuit board. The edge traces are arranged to provide a sensing voltage point that may be measured. Certain threshold voltages may be measured that correspond to different levels of degradation of the traces. Based on the measured values, an abnormal circuit condition may be detected by comparing the measured sensing voltage with the threshold voltage. Depending on severity of the condition, different levels of response ranging from issuing a warning to performing a shut down of the component may be made.

FIG. 1 is an exploded perspective view of a 5G component 100, which is a base station unit in this example. The component 100 includes an exterior housing 110 that is designed to provide protection against environmental factors such as precipitation, extreme cold or heat, and the like. The housing 110 is installed to protect a multi-layer printed circuit board 120. Various components 122 are mounted on the printed circuit board 120. The housing 110 also includes different cable ports 130 that allow external connection to the components 122 of the printed circuit board 120. The entry of cables through the ports 130 also allows humidity and other environmental conditions to penetrate the interior of the housing 110.

In this example, the printed circuit board 120 is a motherboard including processors, memory devices, interface circuits, and a management controller such as a baseboard management controller (BMC) 150. The component 100 may include other circuit boards 140, 142, 144, that may have different components to provide additional functionality for the component 100. For example, the circuit boards 140, 142, 144 in this example may have storage devices, network interfaces, or processors. The BMC 150 on the circuit board 120 allows gathering of voltage sensing data from the circuit boards 120, 140, 142, and 144. In this example, the circuit board 140 is a hard disk drive backplane that includes HDDs attached. The circuit boards 142 and 144 are expansion cards with additional components.

The voltage sensing data may determine whether the circuit boards 120, 140, 142, and 144 have developed or may develop an abnormal circuit condition, such as a short circuit or an open circuit. As will be explained, if any of the circuit boards 120, 140, 142, and 144 are close to failure due to the abnormal circuit condition, the BMC 150 may be programmed to take actions such as issuing a warning, shutting down the specific circuit board, or shutting down the entire component 100 to prevent failure.

Figure 2:
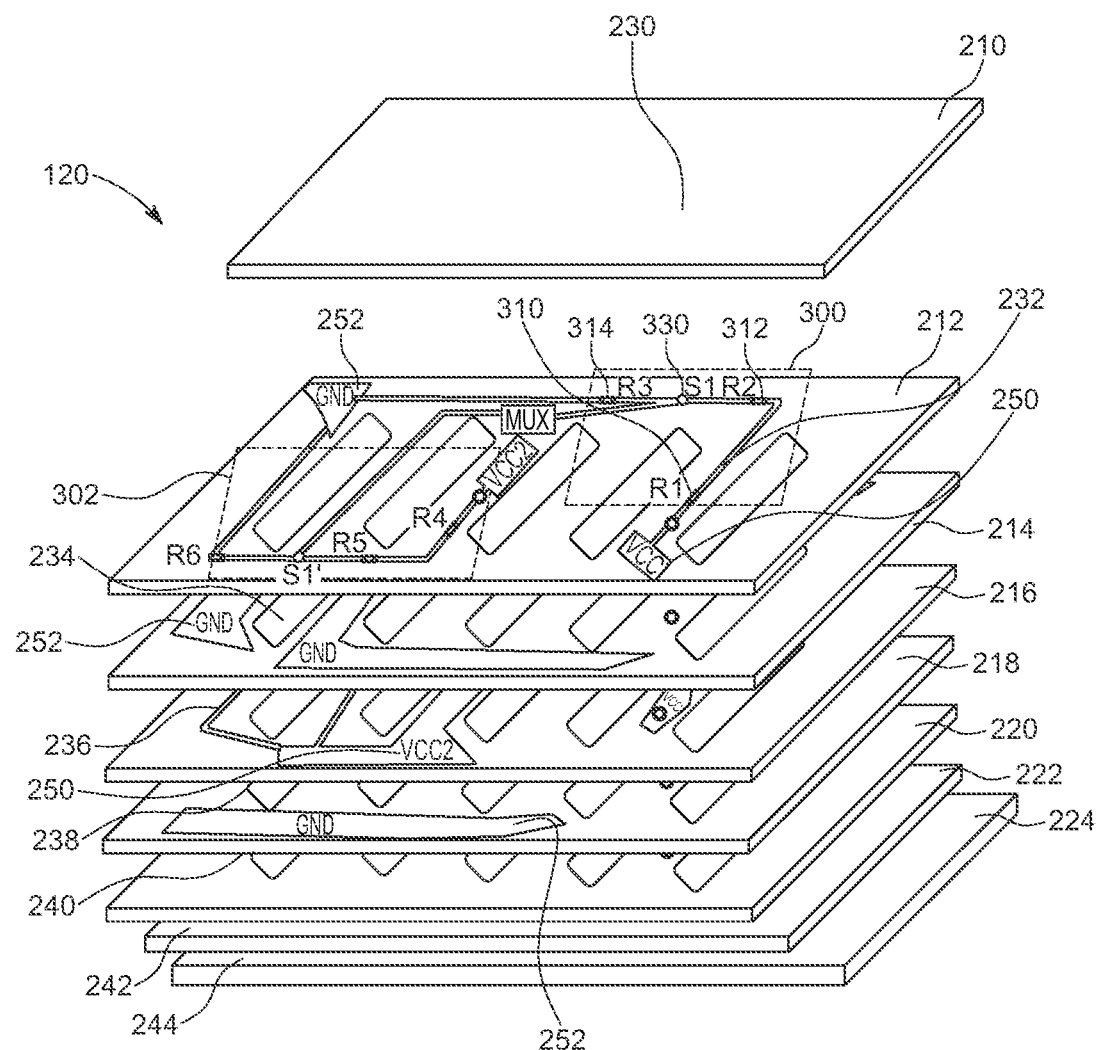
FIG. 2 is a perspective side view of the layers of a printed circuit board of the 5G component in FIG. 1, according to certain aspects of the present disclosure.

FIG. 2 shows a perspective exploded view of the layers of the printed circuit board 120 in FIG. 1. In this example, the printed circuit board 120 includes different layers 210, 212, 214, 216, 218, 220, 222, and 224. Each layer 210, 212, 214, 216, 218, 220, 222, and 224 is fabricated from an insulative material such as reinforced glass fiber with epoxy resin. Conductive trace networks 230, 232, 234, 236, 238, 240, 242, and 244 are formed on each of the corresponding layers 210, 212, 214, 216, 218, 220, 222, and 224. Interconnecting conductive traces are also formed between the trace networks 230, 232, 234, 236, 238, 240, 242, and 244 of each layer.

The component 100 includes a power supply unit that is connected to an external power source. The power supply unit is connected to a voltage regulator on the circuit board 120. The voltage regulator provides a supply voltage on different voltage rails 250 accessible by the trace networks 230, 232, 234, 236, 238, 240, 242, and 244. Another set of ground rails 252 accessible by the trace networks 230, 232, 234, 236, 238, 240, 242, and 244 completes the circuit.

Figure 3:
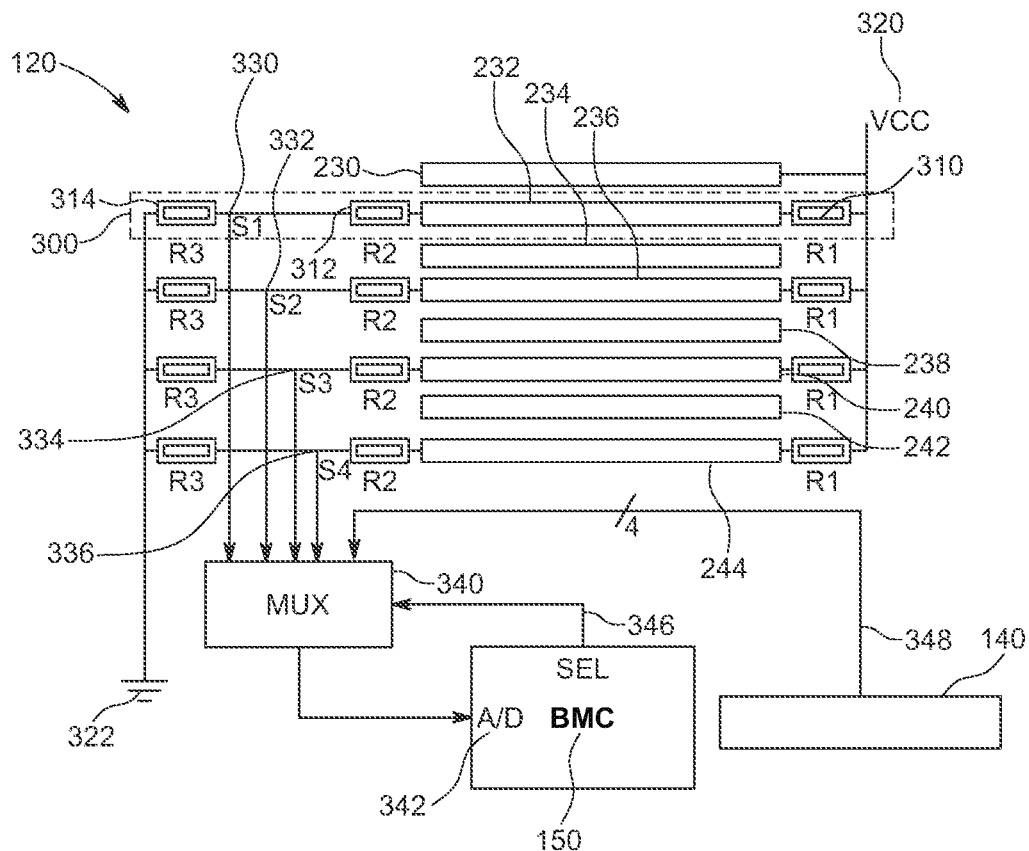
FIG. 3 is a circuit diagram of the trace sensors on the different layers of the printed circuit board and monitoring system, according to certain aspects of the present disclosure.

An example voltage sensor circuit 300 for the printed circuit board 120 in FIG. 2 is shown in FIG. 3. The printed circuit board 120 from FIGS. 1-2 includes a series of layers 210, 212, 214, 216, 218, 220, 222, and 224 that have trace networks 230, 232, 234, 236, 238, 240, 242, and 244. Four of the layers, 212, 216, 220, and 224 have a sensor circuit formed from trace segments of the respective trace network 232, 236, 240, and 244 on those layers. In this example, the trace networks 232, 236, 240, and 244 have traces that function as components of the voltage sensor circuits near the edge of the respective layer.

The traces that form the sensor circuit 300 include sections that are represented by resistors 310, 312, and 314 in FIGS. 2-3. Thus, different trace segments represented by the resistors 310, 312, and 314, in combination with the trace network 232 on the layer 212 in FIG. 2 form the sensor circuit 300 as shown in FIG. 3. The voltage sensor circuit 300 is coupled to a voltage supply or voltage source 320 (Vcc) which is supplied by one of the voltage supply rails 250. The voltage supply 320 is coupled to a trace segment represented by the first resistor 310 (R1) that is connected to the trace network 232. The second resistor 312 (R2) is a trace segment, which is connected in series with the trace network 232 of the layer 212. A sensing point 330 is formed at the opposite end of the second resistor 312. The sensing point 330 is interposed between the second resistor 312 and a trace segment forming the third resistor 314. The opposite end of the third resistor 314 is coupled to a ground lead 322, which is one of the ground rails 252. As shown in FIG. 2, the trace segments that form the resistors 312 and 314 are preferably placed near the edge of the layer 212 in space that is not useable for other circuits.

In this example, each of the four layers 212, 216, 220 and 224 have corresponding sensing points 330, 332, 334 and 336 that are part of sensor circuits. The sensor circuits of the layers 216, 220, and 224 are identical to the sensor circuit 300, as each have three resistors in conjunction with the trace network. Other sensor circuits similar to the sensor circuit 300 may also be formed on other parts of a layer such as the sensor circuit 302 shown in FIG. 2.

The sensing points 330, 332, 334, and 336 are coupled to the inputs of a multiplexer 340. The output of the multiplexer 340 is coupled to an A/D input 342 of a programmable management controller such as the baseboard management controller (BMC) 150. The BMC 150 is coupled to a selection line 346 that allows the BMC 150 to select the input of the multiplexer 340. In this example, the BMC 150 periodically senses the voltage from each of the sensing points 330, 332, 334, and 336 to determine whether a short circuit or an open circuit is beginning to occur on any of the layers of the printed circuit board 120. In this example, the BMC 150 stores the sensed data in a storage device such as a flash memory. During provisioning of the components of the circuit board 120, the components of the circuit board 120 may be initially powered-up. The BMC 150 then stores baseline voltage measurements from each of the sensing points 330, 332, 334, and 336 in the storage device. During normal operation of the circuit board 120, the BMC 150 may execute firmware to analyze the received sensor voltage data in relation to the baseline voltage measurements. Based on the analysis, the BMC 150 may determine potential or actual short circuit or open circuit conditions on the printed circuit board 120. The BMC 150 may issue warnings, determine the severity of the condition, and perform other diagnostic functions relating to the layers of the circuit board 120. Other programmable devices such as processors, FPGAs, CPLDs, and the like or hardwired devices such as ASICs may perform the voltage sensing and analysis functions of the BMC 150 in this example.

Each sensor circuit for a layer, such as the sensor circuit 300 for the layer 212, is powered by the power supply voltage source 320 (Vcc) through a resistor network formed by the trace network 232, the resistors 310, 312, and 314, and ground 322. In this example, the power supply voltage of the voltage source 320 may be a standard level such as 12V, or optionally 24V or 48V for specialized applications such as 5G components. The higher voltage levels may be obtained using a charge pump to boost up a standard level voltage. The differential voltage (V-diff) between two adjacent traces on two neighboring layers is:

$$V\text{-diff}=Vcc*R1/(R1+R2+R3)$$

The voltage from the power supply carried by the trace network such as the trace network 232 generates an electrical field between traces on different layers and thus causes copper crystallization and/or corrosion when humidity or moisture seeps into contact with the layers of the printed circuit board 120. Such crystallization and corrosion in the trace layers have the effect of adjusting the value of R1, which in turn effects the value of V-diff. The V-diff value accelerate/decelerate the effect, consequently, changing the sensitivity of R1. Thus, closing up the traces increases the sensitivity while separating away the traces decreases the sensitivity.

The sensor points, such as the sensing point 330 (S1), are connected to the A/D converter input 342 of the BMC 150 through the inputs of the multiplexer 340. The multiplexer 340 may also have inputs coupled to sensors from another printed circuit board or circuit boards in the component 100. Thus, the BMC 150 may monitor other printed circuit boards in addition to the printed circuit board 120. Alternatively, when only a single voltage sensor circuit is used it may be connected directly in the A/D input 342. The BMC 150 may have other inputs such as GPIO inputs coupled to the different sensor points rather than using the multiplexer 340. Alternatively, the BMC 150 may use a more sophisticated I2C A/D expander to manage multiple sensors through the BMC 150.

The sensing voltage at each of the sensing points, such as the sensing point 330, may be expressed as:

$$V(s1)=Vcc*R3/(R1+R2+R3).$$

The sensing voltage may be compared to previous sensing voltage readings, such as the baseline sensing voltage readings, or a threshold voltage value to determine whether an abnormal circuit condition may be developing. For example, certain changes in the sensed voltage indicate a change in the value of R1, which may indicate the possibility of a short circuit between traces or an open circuit condition. By monitoring the voltage of the sensing points (e.g., sensing point 330 V(s1)), the example system detects potential open circuit or short circuit failures in the layers of the printed circuit board 120.

Figure 4:
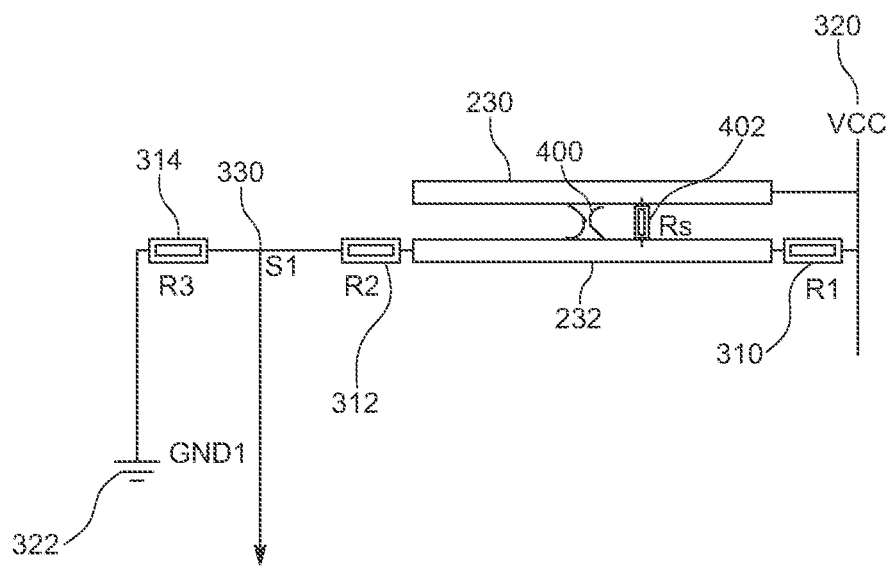
FIG. 4 is a circuit diagram showing a scenario of a short circuit detected between two layers of the printed circuit board in FIG. 2, according to certain aspects of the present disclosure.

FIG. 4 shows a scenario of a short circuit between trace networks of neighboring layers of the printed circuit board 120. Like elements in FIG. 4 are labeled with identical reference numbers as their counterparts in FIG. 3. As explained herein, short circuits may occur between neighboring layers because the trace networks of the neighboring layers are in close proximity to each other. Thus, corrosive effects of humidity interacting with generated electrical fields in the trace networks may create shorts between the trace networks of two stacked layers. In the example shown in FIG. 4, a short circuit bridge 400 has formed between the trace networks 230 and 232 of the layer 210 and the layer 212 from the conductor materials of the trace networks 230 and 232. As explained above, the short circuit bridge 400 may be a result of the electrical field interacting with moisture, causing the bridge 400 to be formed between the trace networks 230 and 232. The short circuit bridge 400 is represented by a resistor 402 (Rs). When the short circuit bridge 400 forms, the voltage from the voltage source 320 is directly transmitted from the trace network 230 to the trace network 232 of the layer 210 through the short circuit bridge 400. The voltage thereby bypasses the first resistor 310 through the short circuit bridge 400. Thus, the sensed voltage at the voltage sensing point 330 will increase because of the diminished effect of the first resistor 310 as the bridge 400 conducts more of the voltage. In a full short circuit, the first resistor 310 (R1) has an infinite value and the sensed voltage is reduced to the drop solely over the second resistor 312 (R2).

Thus, the short circuit resistor 402 is represented by Rs in the following equation:

$$V(s1)=Vcc*R3/(R2+Rs\|R1)$$

In this equation, the value of Rs is reversely proportional to the severity of the short circuit bridge 400. Thus, when the short circuit bridge 400 first forms, Rs is high, but as the bridge 400 increases in size, the resistive value of the resistor 402 (Rs) is lowered. Thus, when the short circuit bridge 400 begins to form, the voltage at the sensing point 330, V(s1), will increase compared to the original value of V(s1) when no short circuit condition is present. As the short circuit worsens with the formation of more conductive material forming the bridge 400, the voltage at the sensing point (V(s1)) 330 will increase. The maximum V(s1) may be expressed as Vcc*R3/(R2+R3) as R1 is effectively shorted out of the sensing circuit.

Shorts based on humidity forming a circuit bridge generally do not occur on a particular layer because the traces in the individual trace networks are spaced in further proximity from each other than the distance between layers. However, corrosion due to moisture may cause open circuit conditions in the trace network in the horizontal plane of a layer. Such open circuits may also be detected by the example sensor system.

Figure 5:
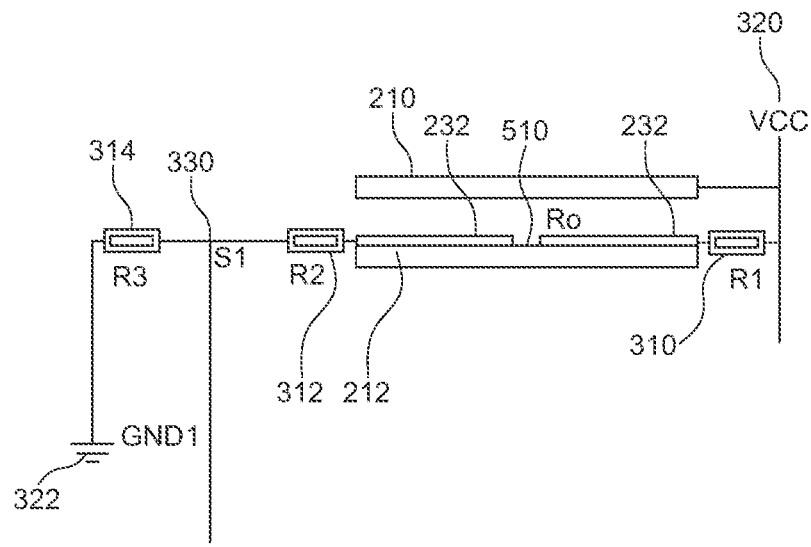
FIG. 5 is a circuit diagram showing a scenario of detecting an open circuit condition on a trace of a single trace layer of the printed circuit board, according to certain aspects of the present disclosure.

FIG. 5 is a circuit diagram of a scenario where an open circuit occurs at the trace network 232 on one of the layers such as the layer 212. Like elements in FIG. 5 are labeled with identical reference numbers as their counterparts in FIG. 3. In this example, an open circuit section 510 occurs as a result of corrosion that results in a trace being broken on the trace network 232. The open circuit section 510 may be represented by a resistance Ro. Thus, the equation for the voltage in this scenario at the sensing point 330 is:

$$V(s1)=Vcc*R3/(R2+Ro+R1)$$

The resistance of the open section 510, Ro is proportional to the severity of the open section 510. When the trace begins to get thin because of the corrosion, leading to an open circuit condition, the voltage at the sensing point 330, V(s1), will decrease compared to the original value of V(s1). When the trace is completely open, the voltage of the sensing point 330, V(s1), will be 0V, reflecting a complete break in the circuit.

In this example, the sensor circuits such as sensor circuit 300 are only formed on every other layer in the printed circuit board 120. Thus, open circuit conditions may only be detected in four of the eight layers in this example. However, a similar sensor circuit formed on the trace networks may be installed for each of the other layers if complete open circuit detection is desired for each of the layers of the printed circuit board 120.

As shown in FIG. 3, the BMC 150 may also be connected to sensing points of other circuit boards such as the circuit board 140. In this example, the circuit board 140 has eight layers. Four of the layers each have similar sensor circuits formed from trace segments at the edge of the layer as well as the trace network on the layer. The sensor circuits of the circuit board 140 each have a sensing point that are each connected to the other inputs of the multiplexer 340 through signal lines 348. Thus, the BMC 150 may select the voltage inputs from the sensing points from either the circuit board 120 or the circuit board 140, or other circuit boards for a component via the selection line 346 to the multiplexer 340. In this manner, the BMC 150 may monitor all of the circuit boards of a particular component for short circuit and open circuit conditions.

When the BMC 150 detects a potential abnormal circuit condition such as a short circuit between layers or an open circuit in a layer of a circuit board, the BMC 150 may be programmed to perform a series of actions. For example, the actions may include logging a potential condition in an error log, sending a warning, shutting down the entire system, managing a power controller, turning off the power supply to a specific circuit board, sending a command to a host operating system (OS) to stop part of circuit from operating, and sending a command to shut down the entire component. The BMC 150 may determine the action based on the severity of the condition.

The traces that constitute the sensor circuit may also be placed near probable areas of failure. For example, in some printed circuit board manufacturing processes, there may be areas of a printed circuit board that are prone to microscopic cracks due to formation of holes through the board or other shaping requirements. These areas may be desirable for placement of the sensor traces as degradation is likely to be initiated near such cracks from moisture. In addition, there may be multiple sensor points at different areas of a layer that may be selected based on factors such as manufacturing data indicating susceptibility to cracks.

The sensing traces could be placed both horizontally at the same layer or vertically at different layers. The sensing traces could be placed in the forbidden keep-out zone of a layer such as close to the edges to conserve layout real estate, and for better sensing to predict degradation.

Figure 6:
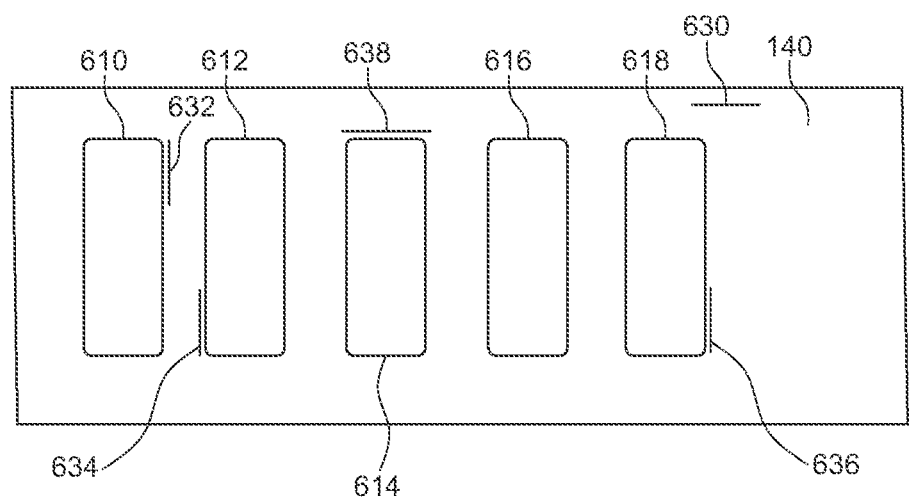
FIG. 6 is an example of trace sensor locations used with an example HDD backplane of the example 5G component in FIG. 1, according to certain aspects of the present disclosure.

FIG. 6 shows the layout of the printed circuit board 140 that may be used as a hard disk drive backplane in FIG. 1. The printed circuit board 140 has a number of large apertures 610, 612, 614, 616, and 618 to accommodate hard disk drives or other components. The formation of the apertures 610, 612, 614, 616, and 618 in the printed circuit board 140 makes such bordering areas susceptible to micro-cracking and thus entry of moisture. Thus, different sensor traces may be fabricated in strategic locations such as near the edges of the apertures 610, 612, 614, 616, and 618 to allow the sensor system to detect short circuit or open circuit conditions.

In this example, a sensor 630 is placed near the edge of the circuit board 140 in forbidden circuit trace design space. This sensor 630 is similar to the sensor trace shown in FIG. 3. Thus, the sensor system may determine short circuits between two of the layers of the circuit board 600 through the sensor 630.

Other sensors are placed near the edges of the apertures 610, 612, 614, 616, and 618. The cutting area around the apertures 610, 612, 614, 616, and 618 are prone to micro fissures and thus are good candidates for sensor placement. Thus, additional sensors such as sensors 632, 634, and 636 are placed near the vertical edges of the apertures 610, 612, and 618. Alternatively, a sensor such as the sensor 638 may be placed around the horizontal edge of the aperture 614. The additional sensors expand the coverage and/or enhance the ability of the detection and diagnostic algorithm executed by the BMC 150 or other management controller to determine abnormal circuit conditions.

Figure 7:
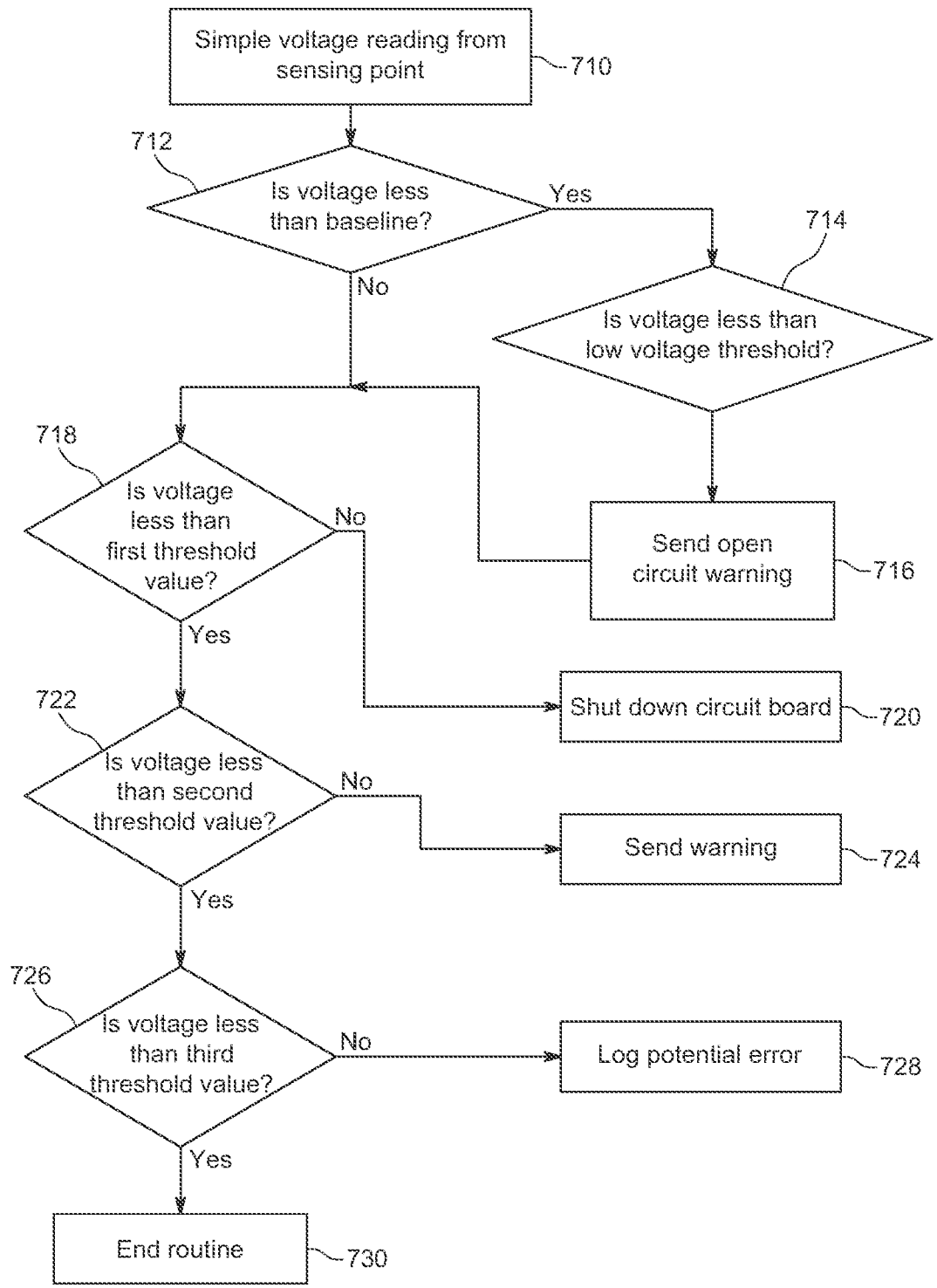
FIG. 7 is a flow diagram of the routine executed by a controller to determine whether a printed circuit board may fail because of an abnormal circuit condition, according to certain aspects of the present disclosure.

FIG. 7 is a flow diagram of a detection and diagnostic routine that may be executed by the BMC 150 in FIG. 3. The routine in FIG. 7 is representative of example machine-readable instructions for reading voltage values from sensor circuits to determine open circuit and short circuit conditions. In this example, the machine-readable instructions comprise an algorithm for execution by: (a) a processor; (b) a controller; and/or (c) one or more other suitable processing device(s). The algorithm may be embodied in software stored on tangible media such as flash memory, CD-ROM, floppy disk, hard drive, digital video (versatile) disk (DVD), or other memory devices. However, persons of ordinary skill in the art will readily appreciate that the entire algorithm and/or parts thereof can, alternatively, be executed by a device other than a processor and/or embodied in firmware or dedicated hardware in a well-known manner (e.g., it may be implemented by an application specific integrated circuit (ASIC), a programmable logic device (PLD), a field programmable logic device (FPLD), a field programmable gate array (FPGA), discrete logic device, etc.). For example, any or all of the components of the routines can be implemented by software, hardware, and/or firmware. Also, some or all of the machine-readable instructions represented by the flowchart may be implemented manually. Further, although the example routine is described herein, persons of ordinary skill in the art will readily appreciate that many other methods of implementing the example machine-readable instructions may alternatively be used.

The detection and diagnosis routine in FIG. 7 may be performed by the BMC 150 on a periodic basis, such as once a day, to determine whether there are any indications of a short circuit or open circuit in the layers of a printed circuit board. The detection and diagnosis routine may be used to monitor a network of trace sensors on different layers and different locations of a printed circuit board as well as multiple printed circuit boards in a computing device managed by the BMC.

In this example, a register or memory accessible by the BMC 150 includes the baseline voltage reading from the sensing point. The initial voltage reading is taken during provisioning of the component and indicates the expected voltage, assuming normal operation of the trace networks of the layers of a circuit board. In this example, the baseline voltage readings for all of the sensing points are stored in flash memory.

The BMC 150 takes a voltage reading from a sensing point such as the sensing point 330 in FIG. 3 (710). The BMC 150 determines whether the voltage is less than the baseline voltage value (712). If the sensed voltage is less than the baseline value, the BMC 150 then compares the sensed voltage to a low threshold value that indicates that an open circuit may be occurring on the trace network (714). If the voltage is lower than the low threshold value (714), the BMC 150 will send a warning signal of a potential open circuit condition on the trace network (716).

The routine then proceeds to compare the sensed voltage reading with a first high threshold value (718). If the voltage is not less than the baseline voltage value or is not lower than the low threshold value, the voltage reading is then compared with the first high threshold value as well (718). If the sensed voltage exceeds the first high threshold value (718), the BMC 150 will shut down the circuit board as a short circuit has occurred between layers (720). If the voltage is less than the first high threshold value, the BMC 150 compares the sensed voltage reading with a second high threshold value and determines whether the sensed voltage reading exceeds the second high threshold value (722). If the voltage reading exceeds the second high threshold value (722), the BMC 150 will send a warning of an imminent failure to a remote monitoring station (724). If the voltage is less than the second high threshold value, the voltage is then compared with a third high threshold value (726). If the sensed voltage exceeds the third high threshold value, the BMC 150 will log a potential error in the system error log in the memory (728). If the sensed voltage is less than the third high threshold value, the routine will end (730). In this example, the threshold values are determined based on factors such as trace width, trace length, and the supply voltage level. Average values may be determined based on the average value of multiple printed circuit board assemblies.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A voltage sensor system comprising:
   a printed circuit board having a plurality of layers, one of the layers including a trace network and a sensor circuit including the trace network and a sensing point, the sensor circuit coupled between a voltage supply and a ground, wherein the trace network of the one of the layers is positioned near at least one area of the one of the layers susceptible to microscopic cracks causing an abnormal circuit condition; and
   a controller coupled to the sensing point, wherein the controller is operable to:
   determine a voltage of the sensing point;
   compare the voltage to a threshold value; and
   based on the comparison, determine an abnormal circuit condition in the printed circuit board.

2. The system of claim 1, further comprising multiple sensor circuits on the other layers of the printed circuit board, each of the sensor circuits including a sensing point.

3. The system of claim 2, further comprising a multiplexer having a plurality of inputs and an output, wherein each of the plurality of inputs is coupled to one of the sensing points, wherein the output is coupled to the controller, and wherein the controller is operable to select one of sensing points.

4. The system of claim 1, wherein the circuit board is a motherboard, and wherein the controller is a baseboard management controller (BMC).

5. The system of claim 1, wherein the threshold value is a predetermined value.

6. The system of claim 1, wherein the threshold value is determined by an initial value of the sensing point that is measured when the printed circuit board is initially powered up.

7. The system of claim 1, wherein the determination of the voltage of the sensing point occurs on a periodic basis.

8. The system of claim 1, wherein the abnormal circuit condition is a short circuit with a trace network of another layer, and the sensing voltage exceeds the threshold voltage.

9. The system of claim 1, wherein the abnormal circuit condition is an open circuit in the trace network, and the voltage is less than the threshold value.

10. A voltage sensor system comprising:
    a printed circuit board having a plurality of layers, one of the layers including a trace network and a sensor circuit including the trace network and a sensing point, the sensor circuit coupled between a voltage supply and a ground, wherein the sensor circuit includes a first resistor coupled to the voltage supply and the trace network, a second resistor coupled to the trace network and the sensing point, and a third resistor coupled between the ground and the sensing point, wherein the first, second and third resistors are trace segments formed near edges of the layer; and
    a controller coupled to the sensing point, wherein the controller is operable to:
    determine a voltage of the sensing point;
    compare the voltage to a threshold value; and
    based on the comparison, determine an abnormal circuit condition in the printed circuit board.

11. A method of determining an abnormal circuit condition in a multi-layer printed circuit board, the method comprising:
    providing a supply voltage to a sensor circuit on one layer of the printed circuit board, the sensor circuit including a trace network on the layer, wherein the trace network on the layer is positioned near at least one area of the layer susceptible to microscopic cracks causing an abnormal circuit condition;
    determining a voltage value from a sensing point of the sensor circuit;
    comparing the voltage value from the sensing point to a threshold voltage value; and
    determining whether an abnormal circuit condition exists based on the comparison via a controller.

12. The method of claim 11, wherein the printed circuit board includes multiple sensor circuits on other layers of the printed circuit board, each of the sensor circuits including a sensing point.

13. The method of claim 11, wherein the printed circuit board is a motherboard, and wherein the controller is a baseboard management controller (BMC).

14. The method of claim 11, wherein the sensor circuit includes a first resistor coupled to the supply voltage and the trace network, a second resistor coupled to the trace network and the sensing point, and a third resistor coupled between a ground and the sensing point, wherein the first, second and third resistors are trace segments formed near edges of the layer.

15. The method of claim 11, wherein the threshold value is a predetermined value.

16. The method of claim 11, wherein the threshold value is determined by an initial value of the sensing point measured when the printed circuit board is initially powered up.

17. The method of claim 11, wherein the determination of the voltage of the sensing point occurs on a periodic basis.

18. The method of claim 11, wherein the abnormal circuit condition is a short circuit with a trace network of another layer, and the voltage of the sensing point exceeds the threshold value.

19. The method of claim 11, wherein the abnormal circuit condition is an open circuit in the trace network, and the voltage of the sensing point is less than the threshold value.

20. A computer device comprising:

a supply voltage source;

a circuit board having multiple layers, each with a trace network, wherein at least one of layer of the multiple layers includes a sensor circuit having the trace network, a sensing point, and trace segments near edges of the at least one layer completing a circuit between the supply voltage source and a ground, wherein the trace network of the at least one layer is positioned near at least one area of the at least one layer susceptible to microscopic cracks causing an abnormal circuit condition; and a baseboard management controller (BMC) coupled to the sensing point, the BMC reading a voltage from the sensing point and comparing the voltage with a threshold voltage to determine an abnormal circuit condition in the circuit board.

* * * * *